(12) United States Patent
Furuhata et al.

(10) Patent No.: US 9,117,957 B2
(45) Date of Patent: Aug. 25, 2015

(54) THIN-FILM SOLAR BATTERY AND METHOD FOR MANUFACTURING THE SAME

(75) Inventors: Takeo Furuhata, Tokyo (JP); Keisuke Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 561 days.

(21) Appl. No.: 13/379,831

(22) PCT Filed: Apr. 23, 2010

(86) PCT No.: PCT/JP2010/057288
§ 371 (c)(1),
(2), (4) Date: Dec. 21, 2011

(87) PCT Pub. No.: WO2011/001735
PCT Pub. Date: Jan. 6, 2011

(65) Prior Publication Data
US 2012/0138146 A1 Jun. 7, 2012

(30) Foreign Application Priority Data
Jul. 1, 2009 (JP) .................. 2009-157095

(51) Int. Cl.
*H01L 31/0232* (2014.01)
*H01L 31/18* (2006.01)
(Continued)

(52) U.S. Cl.
CPC ........ *H01L 31/075* (2013.01); *H01L 31/02366* (2013.01); *H01L 31/0392* (2013.01);
(Continued)

(58) Field of Classification Search
CPC ................ H01L 31/02366; H01L 31/035281; H01L 31/0392; H01L 31/0527; H01L 31/075; H01L 31/0522
See application file for complete search history.

(56) References Cited

U.S. PATENT DOCUMENTS 4,694,116 A * 9/1987 Hayashi et al. ............... 136/256
5,176,758 A * 1/1993 Nath et al. .................... 136/251
(Continued)

FOREIGN PATENT DOCUMENTS

JP  2000 252500  9/2000
JP  3697190      9/2005
(Continued)

OTHER PUBLICATIONS

Convex—Defintion; Free Merriam-Webster Dictionary;http://www.merriam-webster.com/dictionary/convex; accessed May 18, 2014.*
(Continued)

*Primary Examiner* — Jeffrey T Barton
*Assistant Examiner* — Edward Schmiedel
(74) *Attorney, Agent, or Firm* — Oblon, McClelland, Maier & Neustadt, L.L.P.

(57) ABSTRACT

A thin-film solar battery is constructed such that it includes a translucent insulating substrate, a first transparent conductive film formed of a crystalline transparent conductive film on the translucent insulating substrate, with an uneven structure on a surface thereof, a second transparent conductive film formed of a transparent conductive film on the first transparent conductive film, with an uneven structure on a surface thereof, where the uneven structure is more gentle than the uneven structure of the first transparent conductive film, a power generation layer formed on the second transparent conductive film and having at least one crystalline layer to generate power, and a backside electrode layer formed of a light-reflective conductive film on the power generation layer. A substantially convex hollow portion projecting from the translucent insulating substrate is provided between adjacent convex portions in the uneven structure of the first transparent conductive film.

11 Claims, 5 Drawing Sheets

(51) Int. Cl.
*H01L 31/075* (2012.01)
*H01L 31/0236* (2006.01)
*H01L 31/0352* (2006.01)
*H01L 31/0392* (2006.01)
*H01L 31/056* (2014.01)
*H01L 31/054* (2014.01)

(52) U.S. Cl.
CPC ...... *H01L31/035281* (2013.01); *H01L 31/056* (2013.01); *H01L 31/0543* (2013.01); *Y02E 10/52* (2013.01); *Y02E 10/548* (2013.01)

(56) References Cited

U.S. PATENT DOCUMENTS

| | | | |
|---|---|---|---|
| 7,288,797 B2 | 10/2007 | Deguchi et al. | |
| 2004/0219710 A1* | 11/2004 | Dubbeldam | 438/80 |
| 2005/0000564 A1 | 1/2005 | Sato et al. | |
| 2006/0169317 A1 | 8/2006 | Sato et al. | |
| 2007/0209699 A1* | 9/2007 | Sichanugrist et al. | 136/261 |
| 2008/0105299 A1* | 5/2008 | Krasnov | 136/256 |
| 2008/0152868 A1 | 6/2008 | Sato et al. | |
| 2009/0007955 A1* | 1/2009 | Nakashima et al. | 136/244 |
| 2010/0089444 A1* | 4/2010 | Thomsen et al. | 136/256 |

FOREIGN PATENT DOCUMENTS

| | | |
|---|---|---|
| JP | 2007 042534 | 2/2007 |
| WO | 03 036657 | 5/2003 |
| WO | 2005 069388 | 7/2005 |

OTHER PUBLICATIONS

International Search Report Issued May 25, 2010 in PCT/JP10/057288 Filed Apr. 23, 2010.

* cited by examiner

US 9,117,957 B2

THIN-FILM SOLAR BATTERY AND METHOD FOR MANUFACTURING THE SAME

FIELD

The present invention relates to a thin-film solar battery and a method for manufacturing the same, and more particularly to a thin-film solar battery excellent in an optical confinement technique and a method for manufacturing the same.

BACKGROUND

Conventionally, in a thin-film solar battery, by adopting a tandem structure having a film including a crystalline layer in a power generation layer, light in a wide wavelength range of sunlight is absorbed, thereby improving the photoelectric conversion efficiency. To further increase optical absorption in a wide wavelength range of sunlight, an optical confinement technique is applied. As the optical confinement technique, when light enters from a side of a translucent insulating substrate, a method of forming an uneven structure on a surface of a transparent conductive film on the translucent insulating substrate is used.

Regarding the technique for forming the uneven structure, it has been generally known that the photoelectric conversion efficiency of the thin-film solar battery is improved due to a reduction effect of optical reflectivity and a light scattering effect thereof. More specifically, light incident from the side of the translucent insulating substrate is scattered in an interface between the transparent conductive film having the uneven structure and the power generation layer, and then enters into the power generation layer, and thus light enters into the power generation layer substantially diagonally. As the light enters into the power generation layer diagonally, a substantial optical path of light in the power generation layer is extended to increase optical absorption, and thus an output current of the solar battery increases.

conventionally, as a transparent conductive film having such an uneven structure, tin oxide ($SnO_2$) has been well known. Generally, the uneven structure on a surface of tin oxide ($SnO_2$) is formed by causing a growth of crystal grains having a diameter of several tens of nanometers to several micrometers on the film surface by a thermal chemical vapor deposition (CVD) method.

On the other hand, from a viewpoint of being excellent in plasma-resistance and abundant in resource wise, zinc oxide (ZnO) has been prevalent as a material of the transparent conductive film as an alternative to tin oxide ($SnO_2$). When zinc oxide (ZnO) is used as the material of a transparent conductive film, there has been proposed a technique such that a transparent conductive film is first formed on a glass substrate by a sputtering method, and then the transparent conductive film is etched by using acid, thereby forming an uneven structure on a film surface (see, for example, Patent Literature 1). By easily forming an uneven structure using this method, cost reduction is expected in manufacturing thin-film solar batteries.

However, according to the technique of Patent Literature 1 described above, because an uneven structure with steep slopes is formed on a surface of the transparent conductive film by etching, there is a problem that a defect can occur in a power generation layer due to the uneven structure with steep slopes, and this causes deterioration of the yield and reliability. Therefore, in recent years, to achieve a high light scattering performance in a wider wavelength range of sunlight, such a structure having a more microscopic uneven structure on a macroscopic uneven structure on a surface of a transparent conductive film has been proposed (see, for example, Patent Literature 2).

CITATION LIST

Patent Literatures

Patent Literature 1: Japanese Patent No. 3697190
Patent Literature 2: International Publication No. WO 2003/036657

SUMMARY

Technical Problem

However, according to the technique of Patent Literature 2 described above, because a microscopic uneven structure is provided, the number of irregularities on the surface of a transparent conductive film increases. Accordingly, at the time of forming a power generation layer including a crystalline layer, more crystals growing in a direction perpendicular to a substrate surface collide with each other, thereby causing such problems that defects in the power generation layer increase and an output voltage decreases. Therefore, in such an uneven structure (a texture structure) of a transparent conductive film, it has been difficult to realize an improvement of the photoelectric conversion efficiency.

The present invention has been achieved to solve the above problems, and an object of the present invention is to provide a thin-film solar battery having a high light scattering performance in a wide wavelength range of sunlight and an excellent photoelectric conversion efficiency, and a manufacturing method thereof.

Solution to Problem

In order to solve the afore-mentioned problems, a thin-film solar battery according to a first aspect of the present invention is constructed in such a manner as to include: a translucent insulating substrate; a first transparent conductive film formed of a crystalline transparent conductive film on the translucent insulating substrate and having an uneven structure on a surface thereof; a second transparent conductive film formed of a transparent conductive film on the first transparent conductive film and having an uneven structure on a surface thereof, where the uneven structure is more gentle than the uneven structure of the first transparent conductive film; a power generation layer formed on the second transparent conductive film and having at least one crystalline layer to generate power; and a backside electrode layer formed of a light-reflective conductive film on the power generation layer, wherein a substantially convex hollow portion projecting from the translucent insulating substrate toward the power generation layer is provided between adjacent convex portions in the uneven structure of the first transparent conductive film.

Advantageous Effects of Invention

According to the present invention, a structure having a high light scattering performance in a wide wavelength range of sunlight without increasing the number of irregularities on a surface of a transparent conductive film in a transparent electrode layer can be realized, thereby enabling to achieve a thin-film solar battery that effectively utilizes a wide wavelength range of sunlight and has an excellent photoelectric conversion efficiency.

BRIEF DESCRIPTION OF DRAWINGS

FIG. 2-1 is a sectional view for explaining an example of a manufacturing process of the thin-film solar battery according to the first embodiment of the present invention.

FIG. 2-2 is a sectional view for explaining an example of the manufacturing process of the thin-film solar battery according to the first embodiment of the present invention.

FIG. 2-3 is a sectional view for explaining an example of the manufacturing process of the thin-film solar battery according to the first embodiment of the present invention.

FIG. 2-4 is a sectional view for explaining an example of the manufacturing process of the thin-film solar battery according to the first embodiment of the present invention.

FIG. 2-5 is a sectional view for explaining an example of the manufacturing process of the thin-film solar battery according to the first embodiment of the present invention.

FIG. 3 is a top view of a region of a hollow portion on a translucent insulating substrate in the manufacturing process of the thin-film solar battery according to the first embodiment of the present invention.

FIG. 4-1 is a sectional view for explaining an example of a manufacturing process of a thin-film solar battery according to a second embodiment of the present invention.

FIG. 4-2 is a sectional view for explaining an example of the manufacturing process of the thin-film solar battery according to the second embodiment of the present invention.

FIG. 4-3 is a sectional view for explaining an example of the manufacturing process of the thin-film solar battery according to the second embodiment of the present invention.

DESCRIPTION OF EMBODIMENTS

Figure 1:
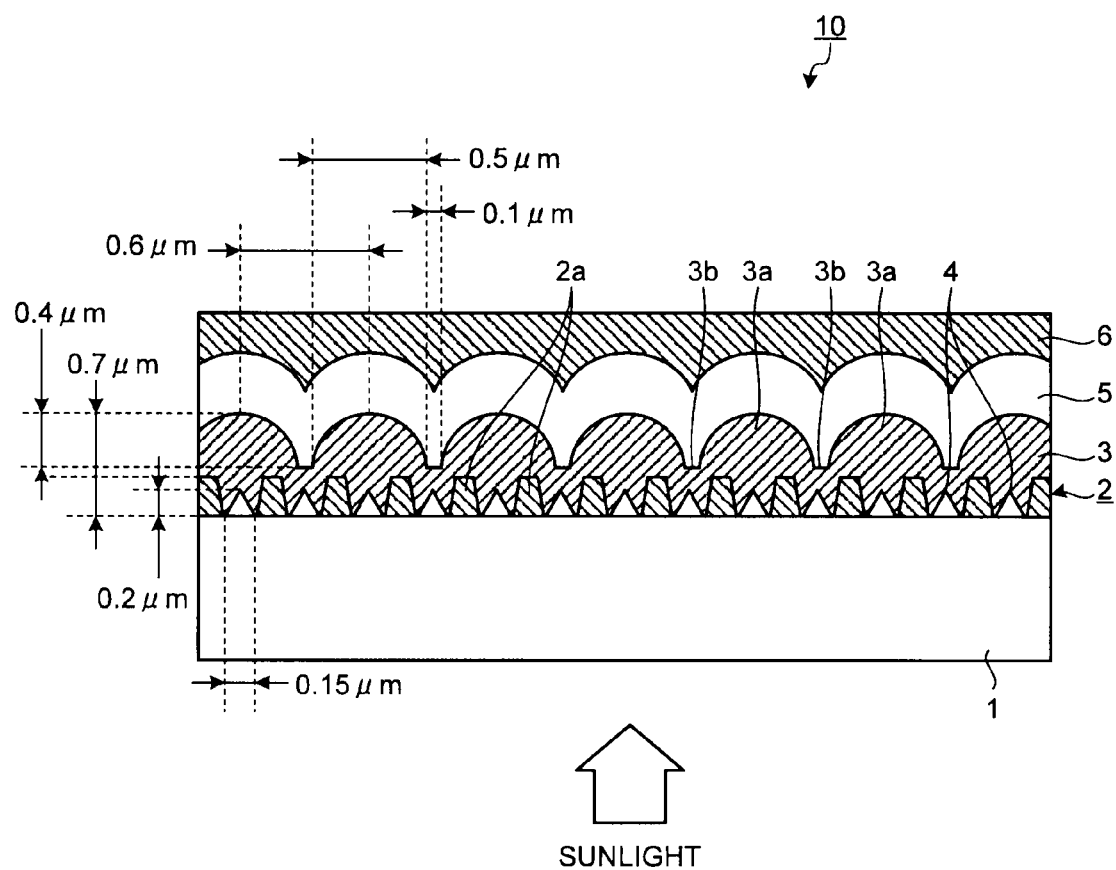
FIG. 1 is a sectional view of a schematic configuration of a thin-film solar battery according to a first embodiment of the present invention.

Exemplary embodiments of a thin-film solar battery and a method for manufacturing the same according to the present invention will be explained below in detail with reference to the accompanying drawings. The present invention is not limited to the following embodiments, and changes and modifications can be appropriately made without departing from the scope of the present invention. In addition, in the drawings explained below, to facilitate understanding, scales of respective members can be different from actual products. The same applies to relationships between the drawings.

First Embodiment

FIG. 1 is a sectional view of a schematic configuration of a thin-film solar battery 10 according to a first embodiment of the present invention. The thin-film solar battery 10 includes a translucent insulating substrate 1, a first transparent conductive film 2 formed on the translucent insulating substrate 1, a second transparent conductive film 3 formed on the first transparent conductive film 2 and having an uneven structure on a surface thereof, a power generation layer 5 formed on the second transparent conductive film 3, and a backside electrode layer 6 formed on the power generation layer 5. A transparent electrode layer serving as a first electrode layer is constituted by the first transparent conductive film 2 and the second transparent conductive film 3. Furthermore, a hollow portion 4 is provided between adjacent convex portions in the first transparent conductive film 2.

As the translucent insulating substrate 1, an insulating substrate having translucency is used. Generally, a material having a high transmission factor is used for the translucent insulating substrate 1, and for example, a glass substrate having a small rate of absorption from a visible region to a near-infrared region is used. As the glass substrate, an alkali-free glass substrate can be used, or an inexpensive blue plate glass can be also used.

The first transparent conductive film 2 is formed of a transparent conductive film and has an uneven structure. As the first transparent conductive film 2, for example, a crystallized zinc oxide (ZnO) film, a film using at least one type of element selected from Al, Ga, In, B, Y, Si, Zr, and Ti as a dopant in the zinc oxide film, or a transparent conductive film formed by laminating these films is used. Furthermore, a crystallized zinc oxide film and the like are mentioned as the first transparent conductive film 2 in the above explanations; however, the first transparent conductive film 2 is not limited thereto, and any transparent conductive film crystallized and having a high optical transparency can be used. As such a transparent conductive film, for example, a crystallized film of $SnO_2$, $In_2O_3$, ZnO, CdO, $CdIn_2O_4$, $CdSnO_3$, $MgIn_2O_4$, $CdGa_2O_4$, $GaInO_3$, $InGaZnO_4$, $Cd_2Sb_2O_7$, $Cd_2GeO_4$, $CuAlO_2$, $CuGaO_2$, $SrCu_2O_2$, $TiO_2$, or $Al_2O_3$, or a transparent conductive film formed by laminating these films can be used. Furthermore, films using at least a type of element selected from Al, Ga, In, B, Y, Si, Zr, and Ti as a dopant in these films, or a transparent conductive film formed by laminating these films can be used.

The first transparent conductive film 2 can be formed by using, for example, a physical method such as a DC sputtering method, a vacuum deposition method, or an ion plating method, or a chemical method such as a spray method, a dip method, or a CVD method.

Further, the first transparent conductive film 2 includes a hollow portion 4, respectively between adjacent convex portions 2a in the first transparent conductive film 2 as shown in FIG. 1. The hollow portions 4 are provided substantially parallel to each other in a depth direction of the drawing. The shape of the hollow portion 4 between the convex portions 2a is such that the hollow portion 4 projects from the translucent insulating substrate 1 toward the power generation layer 5, a sectional shape thereof is substantially triangle (convex) with the surface of the translucent insulating substrate 1 being used as a bottom face thereof, the height is about 0.2 micrometer, and the width of the bottom face is about 0.15 micrometer on the short side, with the long side (in the depth direction of the drawing) being the length of the translucent insulating substrate 1. A distance from the center of the hollow portion 4 to the center of an adjacent hollow portion 4, sandwiching the convex portion 2a of the first transparent conductive film 2 therebetween, is about 0.3 micrometer.

The second transparent conductive film 3 is formed of a transparent conductive film, and has an uneven structure, which is curved more gently than the uneven structure of the first transparent conductive film 2. As the second transparent conductive film 3, for example, a tin oxide ($SnO_2$) film, a film using at least one type of element selected from Al, Ga, In, B, Y, Si, Zr, Ti, and F as a dopant in the tin oxide film, or a transparent conductive film formed by laminating these films is used. Further, a tin oxide ($SnO_2$) film and the like are mentioned as the second transparent conductive film 3 in the above explanations; however, the second transparent conductive film 3 is not limited thereto, and any transparent conductive film having a high optical transparency can be used. As such a transparent conductive film, for example, a film of $In_2O_3$, ZnO, CdO, $CdIn_2O_4$, $CdSnO_3$, $MgIn_2O_4$, $CdGa_2O_4$, $GaInO_3$, $InGaZnO_4$, $Cd_2Sb_2O_7$, $Cd_2GeO_4$, $CuAlO_2$, $CuGaO_2$, $SrCu_2O_2$, $TiO_2$, or $Al_2O_3$, or a transparent conductive film formed by laminating these films can be used. Furthermore, a film using at least one type of element selected from Al, Ga, In, B, Y, Si, Zr, Ti, and F as a dopant in these films, or a transparent conductive film formed by laminating these films can be used.

The second transparent conductive film 3 can be formed by using, for example, a physical method such as a DC sputtering method, a vacuum deposition method, or an ion plating method, or by using a chemical method such as a spray method, a dip method, or a CVD method.

As shown in FIG. 1, in the second transparent conductive film 3, a film thickness of a convex portion 3a is about 0.7 micrometer from the surface of the translucent insulating substrate 1, the height difference between the convex portion 3a and an upper face of a concave portion 3b of the second transparent conductive film 3 is about 0.4 micrometer, a gap between apexes of the convex portions 3a is about 0.6 micrometer, and the width of a bottom face of the convex portion 3a is about 0.5 micrometer. Therefore, the width of the concave portion 3b becomes about 0.1 micrometer.

The power generation layer 5 has a p-n junction or a pin junction, and is formed by laminating at least two layers of a thin-film semiconductor layer that generates power by incident light. The power generation layer 5 includes, for example, a first power generation layer (not shown) formed of a p-type amorphous silicon carbide film (an a-SiC film) as a first conductive semiconductor layer, a buffer layer, an i-type amorphous silicon film (an a-Si film) as a second conductive semiconductor layer, and an n-type amorphous silicon film (an a-Si film) as a third conductive semiconductor layer, and a second power generation layer (not shown) formed of a p-type microcrystalline silicon film as the first conductive semiconductor layer, an i-type microcrystalline silicon film as the second conductive semiconductor layer, and an n-type microcrystalline silicon film as the third conductive semiconductor layer, from the side of the second transparent conductive film 3. The power generation layer 5 has a crystalline layer in either one of these layers.

An amorphous silicon film or a crystalline silicon film such as an amorphous silicon germanium or microcrystalline silicon germanium can be used for each layer of the power generation layer 5. Further, the power generation layer 5 can have a single structure in which a pin structure has a single stage, or a structure in which the pin structure is overlapped in three stages.

An intermediate layer formed of a transparent conductive film can be formed between the first power generation layer and the second power generation layer. The intermediate layer film is formed of a film having both optical transparency and light reflectivity, and also electrical conductivity. Because the intermediate layer can reflect light incident on the first power generation layer, it has an effect of increasing an effective film thickness of the first power generation layer, and can adjust the output current density of the first and second power generation layers, thereby enabling to improve module characterization. As such an intermediate layer, a film of zinc oxide (ZnO), indium tin oxide (ITO), tin oxide ($SnO_2$), or silicon monoxide (SiO) can be used.

The backside electrode layer 6 is a second electrode layer formed of a conductive film that reflects light, and for example, an aluminum (Al) film having a film thickness of about 200 nanometers is used. A silver (Ag) film having a high optical reflectance can be used other than the aluminum (Al) film. Furthermore, to prevent metallic diffusion to the silicon in the power generation layer 5, a transparent conductive film of zinc oxide (ZnO), indium tin oxide (ITO), tin oxide ($SnO_2$) or the like can be inserted between the power generation layer 5 and the backside electrode layer 6. The backside electrode layer 6 is formed by a known method such as a sputtering method, a CVD method, or a spray method.

In the thin-film solar battery 10 according to the present embodiment configured as described above, a sufficient light scattering effect can be achieved with respect to sunlight incident from the side of the translucent insulating substrate 1, by providing the hollow portion 4 respectively between adjacent convex portions 2a in the first transparent conductive film 2. That is, some part of the sunlight incident from the side of the translucent insulating substrate 1 enters respective convex portions 2a in the first transparent conductive film 2, is scattered in an interface between the convex portions 2a and the second transparent conductive film 3, and enters the second transparent conductive film 3. Further, some other part of the sunlight incident from the side of the translucent insulating substrate 1 enters the hollow portions 4, is scattered in an interface between the hollow portions 4 and the second transparent conductive film 3, and enters into the second transparent conductive film 3. Consequently, by providing the convex portions 2a and the hollow portions 4, a sufficient light scattering effect can be achieved with respect to sunlight incident from the side of the translucent insulating substrate 1, without increasing the number of the convex portions 2a. Furthermore, because the bottom face of the hollow portion 4 is formed by the translucent insulating substrate 1, much sunlight directly enters from the side of the translucent insulating substrate 1, thereby achieving a sufficient light scattering performance.

Further, because a sufficient light scattering performance can be achieved by providing such hollow portions 4 in the first transparent conductive film 2, the number of irregularities on the surface of the first transparent conductive film 2 can be reduced, thereby enabling to suppress the occurrence of a defect in the power generation layer 5 resulting from irregularities on the surface of the first transparent conductive film 2. Consequently, a decrease in an output voltage due to a defect in the power generation layer 5 can be prevented, thereby enabling to achieve a high photoelectric conversion efficiency. That is, a high photoelectric conversion efficiency can be realized without causing such problems that the number of defects in the power generation layer increase due to an increase in the number of irregularities on the surface of the first transparent conductive film and the output voltage decreases, as was often the case in conventional techniques.

Further, in the thin-film solar battery 10 according to the present embodiment, the second transparent conductive film 3 is formed on the first transparent conductive film 2, and the power generation layer 5 is formed thereon. Accordingly, irregularities with steep slopes on a transparent conductive film in an interface between the transparent conductive film in the transparent electrode layer and the power generation layer 5 are eased, thereby enabling to suppress the occurrence of a defect in the power generation layer 5 resulting from irregularities with steep slopes, and to improve the yield and reliability.

Consequently, according to the thin-film solar battery 10 of the present embodiment, a structure having a high light scattering performance in a wide wavelength range of sunlight is realized without increasing the number of irregularities on the surface of the transparent conductive film in the transparent electrode layer, thereby achieving a thin-film solar battery having an excellent photoelectric conversion efficiency, which effectively utilizes a wide wavelength range of sunlight.

In the above explanations, the shape of the hollow portion 4 is substantially triangle (convex) with the surface of the translucent insulating substrate 1 being used as the bottom face thereof. However, the surface of the translucent insulating substrate 1 may not be used as the bottom face, the first transparent conductive film 2 can be present in a region between the convex portions 2a on the translucent insulating substrate 1, and the hollow portions 4 having a shape projecting toward the power generation layer 5 can be provided on the first transparent conductive film 2.

A method for manufacturing the thin-film solar battery 10 according to the present embodiment configured as described above is explained next. FIG. 2-1 to FIG. 2-5 are sectional views for explaining an example of a manufacturing process of the thin-film solar battery 10 according to the present embodiment.

First, the translucent insulating substrate 1 is prepared. An alkali-free glass substrate is used here as the translucent insulating substrate 1. An inexpensive blue plate glass can be also used as the translucent insulating substrate 1. However, in this case, to prevent diffusion of alkaline components from the translucent insulating substrate 1, it is desired to form an $SiO_2$ film with a thickness of about 50 nanometers by a PCVD method or the like.

Figures 1, 2:
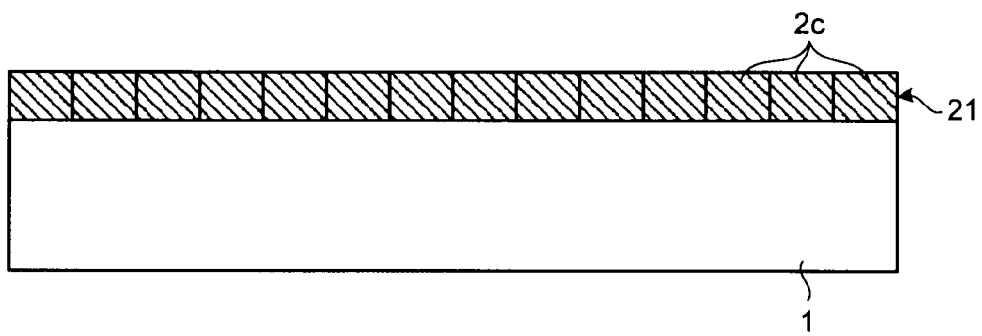
Figure 2:
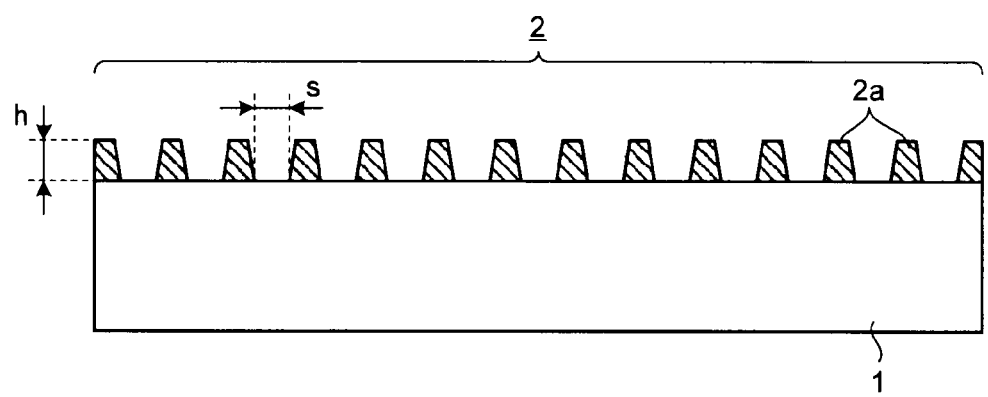

As a transparent conductive film serving as the first transparent conductive film 2, a zinc oxide (ZnO) film having a film thickness of 0.45 micrometer containing 0.3 weight % of aluminum (Al) dopant is then formed on the translucent insulating substrate 1 by a sputtering method, to form a crystallized transparent conductive film 21 having crystal grains 2c (FIG. 2-1). The size in the horizontal width of the crystal grains 2c is about 0.3 micrometer. As a method for forming the transparent conductive film 21, a physical method such as a vacuum deposition method or an ion plating method, or a chemical method such as a spray method, a dip method, or a CVD method can be used. Further, heat treatment can be applied to control the size of the crystal grains 2c and improve the mobility of the film.

After the transparent conductive film 21 is immersed in an aqueous solution containing 0.3 weight % of hydrochloric acid at a solution temperature of 30° C. for 90 seconds, washing by pure water for 1 minute or more and drying are performed. By this processing, etching proceeds in a crystal grain boundary, where etching can be easily done, until the surface of the translucent insulating substrate 1 is exposed to form depressions, thereby forming the first transparent conductive film 2 on which many convex portions 2a are arranged (FIG. 2-2).

Figures 2, 3:
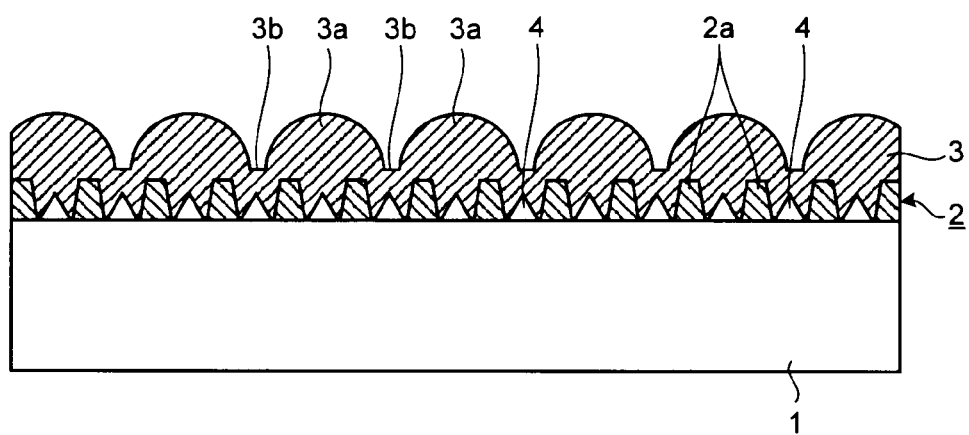

As a solution to be used for etching, 0.3 weight % of hydrochloric acid is used in the present embodiment. However, the present invention is not limited thereto, and for example, one type of acid selected from sulfuric acid, nitric acid, hydrofluoric acid, acetic acid, formic acid and the like or a mixture of two or more of these acids can be mentioned as the solution. By this etching process, the film thickness from the translucent insulating substrate 1 to the convex portions 2a of the first transparent conductive film 2 becomes 0.3 micrometer, and an aspect ratio (h/s) obtained by dividing a height h of a depressed portion by a short side s of a bottom face of the depressed portion is 0.3/0.15 μm=2 in a depression between adjacent convex portions 2a, and 0.3/0.21 μm=1.4 in a depression between the adjacent convex portions 2a on a diagonal line as shown in FIG. 3. A side angle of the depression is 85 degrees, designating an angle in an in-plane direction of the bottom face as 0 degree. FIG. 3 is a top view of a region of the hollow portion 4 on the translucent insulating substrate 1.

The second transparent conductive film 3 is formed next by using an atmospheric-pressure thermal CVD method (FIG. 2-3). The temperature of the transparent conductive film 21 and the temperature in the film forming chamber are heated, for example, up to 540° C., and tin tetrachloride, water, and hydrogen chloride gas are simultaneously sprayed with a flow ratio of hydrogen chloride to tin tetrachloride being 2.0, thereby forming irregularities on the surface. At this time, the second transparent conductive film 3 is not formed at the bottom of depressions on the first transparent conductive film 2 to have an overhanging shape, and the hollow portion 4 is formed there, using the translucent insulating substrate 1 as a bottom face thereof. The formation of the hollow portions 4 occurs because reactive species are more likely to reach the convex portions as compared to the concave portions, and thus the convex portions are preferentially film-formed. With the above-mentioned aspect ratio, the length of the short side of the bottom face of the depression, and the side angle of the depression, the hollow portions 4 are formed in any depression between the convex portions 2a on the diagonal line of the first transparent conductive film 2 and between the adjacent convex portions 2a.

There has been explained an example in which etching is performed with respect to the transparent conductive film 21 until the surface of the translucent insulating substrate 1 is exposed; however, even if the surface of the translucent insulating substrate 1 is not completely exposed at the bottom of the depression on the transparent conductive film 21, the hollow portions 4 are formed between adjacent convex portions 2a.

On the other hand, the surface shape of the second transparent conductive film 3 is hardly affected by irregularities on an underlying layer. That is, the surface shape of the second transparent conductive film 3 is hardly affected by the convex portions 2a of the first transparent conductive film 2. This is because film formation of the second transparent conductive film 3 proceeds in the overhanging shape in the depressed portions of the underlying layer, and film formation reaches immediately up to the height of the convex portions even if there are depressed portions in the underlying layer.

Accordingly, for example, the film thickness of the convex portion 3a of the second transparent conductive film 3 becomes about 0.7 micrometer, the height difference between the upper face of the convex portion 3a and the upper face of the concave portion 3b of the second transparent conductive film 3 becomes about 0.4 micrometer. Furthermore, the gap between apexes of the convex portions 3a becomes about 0.6 micrometer, and the width of the bottom face of the convex portion 3a becomes about 0.5 micrometer, and thus the width of the concave portion 3b becomes about 0.1 micrometer. The shape of the hollow portion 4 is such that the hollow portion 4 projects from the translucent insulating substrate 1 toward the power generation layer 5, the sectional shape thereof is substantially triangle (convex) with the surface of the translucent insulating substrate 1 being used as the bottom face thereof, the height is about 0.2 micrometer, and the width of the bottom face is about 0.15 micrometer on the short side, with the long side (in the depth direction of the drawing) being the length of the translucent insulating substrate 1. The distance from the center of the hollow portion 4 to the center of an adjacent hollow portion 4, sandwiching the convex portion 2a of the first transparent conductive film 2 therebetween, is about 0.3 micrometer. As shown in FIG. 3, an area occupied by the hollow portions 4 in the plane of the first transparent conductive film 2 is substantially 75% as viewed from above.

In the present embodiment, as a method for forming the second transparent conductive film 3, a thermal CVD method is used; however, the method for forming the second transparent conductive film 3 is not limited thereto, and other methods such as a plasma CVD method can be also used.

Figures 2, 3, 4:
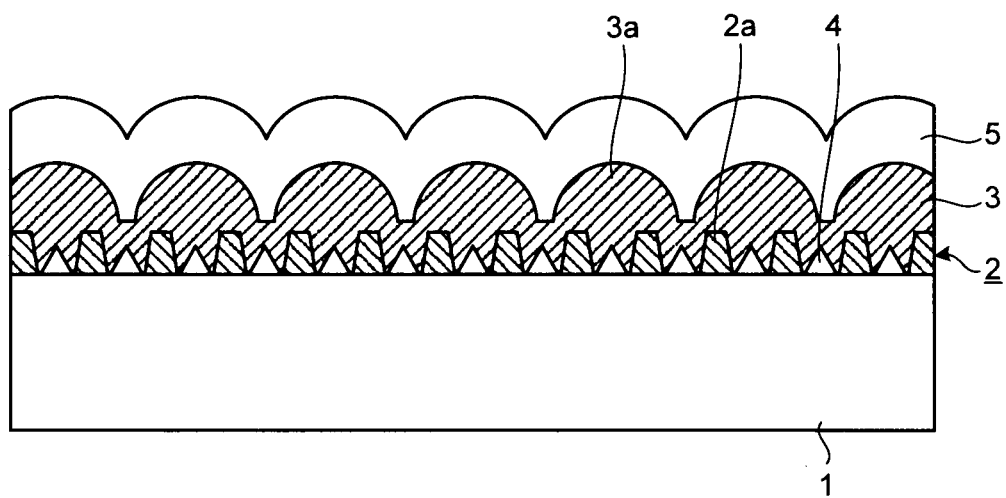
Figures 2, 3, 4, 5:
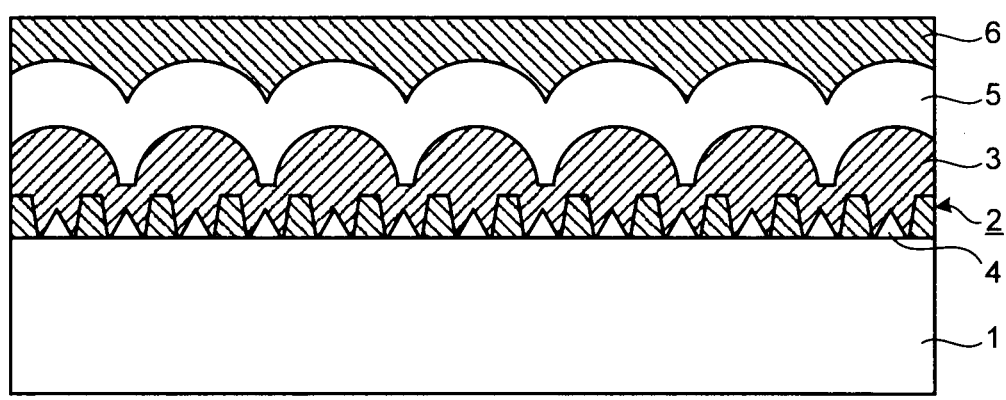
Figure 3:
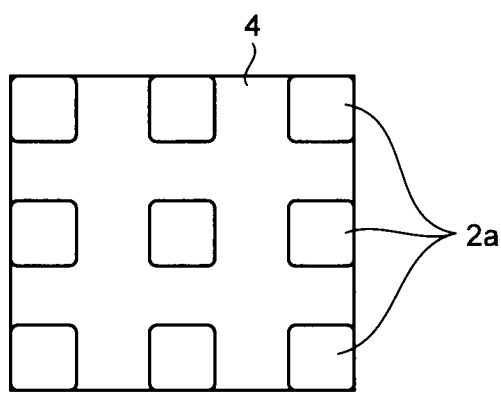
Figures 1, 4:
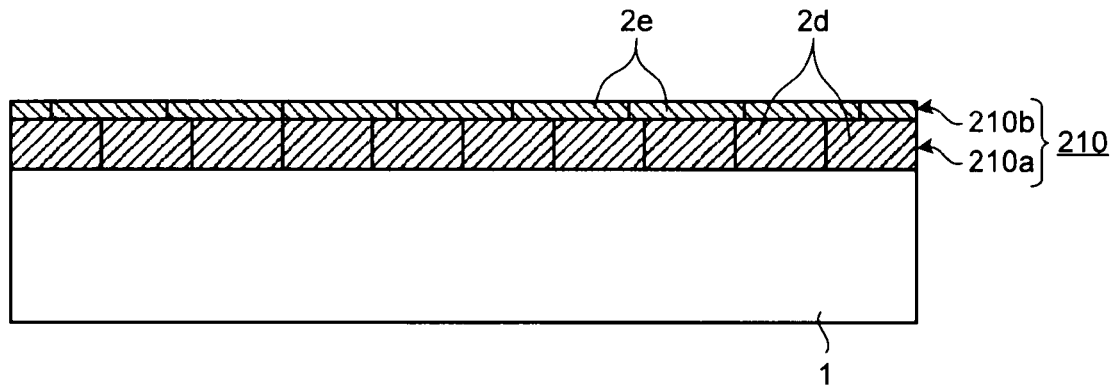
Figures 2, 4:
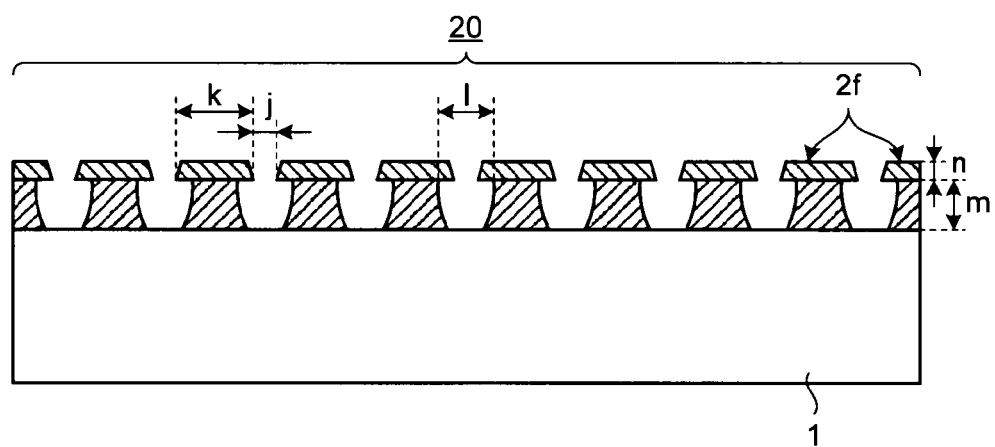
Figures 3, 4:
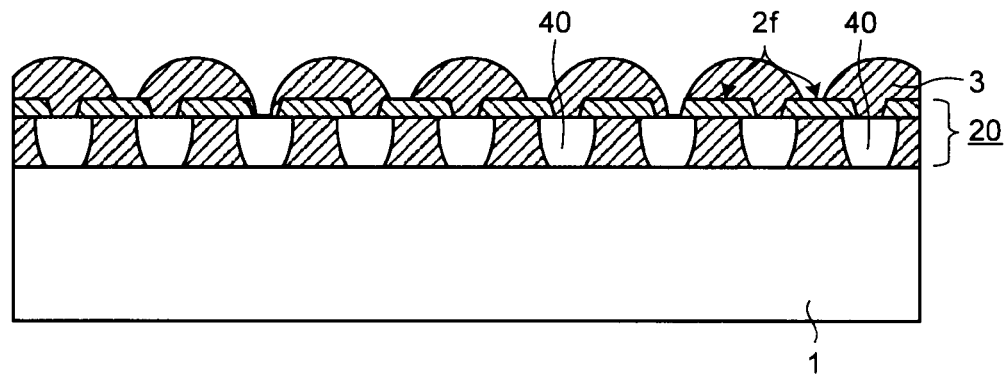

The power generation layer 5 is then formed on the second transparent conductive film 3 by a plasma CVD method. In the present embodiment, as the power generation layer 5, the first power generation layer (not shown) formed of a p-type amorphous silicon carbide film (an a-SiC film) as the first conductive semiconductor layer, a buffer layer, an i-type amorphous silicon film (an a-Si film) as the second conductive semiconductor layer, and an n-type amorphous silicon film (an a-Si film) as the third conductive semiconductor layer, and a second power generation layer (not shown) formed of a p-type microcrystalline silicon film as the first conductive semiconductor layer, an i-type microcrystalline silicon film as the second conductive semiconductor layer, and an n-type microcrystalline silicon film as the third conductive semiconductor layer are sequentially laminated from the side of the second transparent conductive film 3 (FIG. 2-4).

An intermediate layer formed of a transparent conductive film can be formed between the first power generation layer and the second power generation layer. The intermediate layer is formed of a film having both optical transparency and light reflectivity, and also electrical conductivity. As such an intermediate layer, a film of zinc oxide (ZnO), indium tin oxide (ITO), tin oxide ($SnO_2$), or silicon monoxide (SiO) can be used.

The backside electrode layer 6 is then formed on the power generation layer 5 by a sputtering method (FIG. 2-5). In the present embodiment, an aluminum (Al) film having a film thickness of about 200 nanometers is formed; however, a silver (Ag) film having a high optical reflectance can be used. To prevent metallic diffusion to the silicon, a transparent conductive film of zinc oxide (ZnO), indium tin oxide (ITO), tin oxide ($SnO_2$) or the like can be formed between the power generation layer 5 and the backside electrode layer 6. According to the procedure described above, the thin-film solar battery 10 as shown in FIG. 1 is completed.

A characteristic evaluation of a thin-film solar battery manufactured by the method for manufacturing a thin-film solar battery according to the present embodiment is explained next. The thin-film solar battery manufactured by the method for manufacturing a thin-film solar battery according to the present embodiment was used as a thin-film solar battery of an Example 1. Furthermore, a thin-film solar battery manufactured by forming tin oxide ($SnO_2$) having a macroscopic uneven structure on the surface thereof on a glass substrate as a transparent electrode layer by an atmospheric-pressure thermal CVD method is used as a thin-film solar battery of a conventional example 1. Further, a thin-film solar battery including a transparent electrode layer having an uneven structure formed on the surface thereof was manufactured by forming a zinc oxide (ZnO) film serving as a transparent electrode film on a glass substrate and etching by using acid with respect to the zinc oxide (ZnO) film, and this thin-film solar battery was used as a thin-film solar battery of a conventional example 2. The thin-film solar batteries of a conventional example 1 and a conventional example 2 are the same as the thin-film solar battery of the Example 1, except for the structure of the transparent electrode layer.

Light of AM (Air Mass) 1.5 was respectively caused to enter each of these thin-film solar batteries from a substrate side with a light quantity of 100 $mW/cm^2$ by using a solar simulator, to evaluate the characteristics as a solar battery. The measurement temperature is 25° C. The results thereof are shown in Table 1.

TABLE 1

|  | Short-circuit current ($mA/cm^2$) | Open-circuit voltage (V) |
| --- | --- | --- |
| Example 1 | 12 | 1.42 |
| Conventional example 1 | 11.2 | 1.42 |
| Conventional example 2 | 11.2 | 1.41 |

From the Table 1, it is understood that in the thin-film solar battery in the Example 1, a short-circuit current is improved as compared to the thin-film solar batteries in the conventional example 1 and the conventional example 2. Furthermore, in the thin-film solar battery in the Example 1, no decrease in an open-circuit voltage occurs as compared to the conventional example 1 and the conventional example 2. Accordingly, it was confirmed that the thin-film solar battery in the Example 1 achieved excellent output characteristics.

Further, a haze ratio (%), which is ((diffuse transmittance/total transmittance)×100), of the transparent conductive film (the transparent electrode layer) after a texture structure (an uneven structure) was formed was evaluated. The haze ratio is a numerical value expressing a degree of light diffusion. It was confirmed that in the transparent conductive film (the transparent electrode layer) of the thin-film solar battery of the Example 1, a haze ratio of 10% or higher was obtained in a wavelength range from 300 to 900 nanometers, and the haze ratio increased than that of the transparent conductive film (the transparent electrode layer) of the thin-film solar battery of the conventional example 1, thereby improving the light scattering effect. In this manner, in the thin-film solar battery of the Example 1, the short-circuit current can be improved by increasing the light confinement effect in the transparent conductive film (the transparent electrode layer).

Further, in the transparent conductive film (the transparent electrode layer) of the thin-film solar battery of the conventional example 2, irregularities with steep slopes are formed on the surface thereof by etching, whereas in the transparent conductive film (the transparent electrode layer) of the thin-film solar battery of the Example 1, a transparent conductive film is further formed thereon after etching. Therefore, the formation of irregularities with steep slopes on the surface thereof can be prevented. Therefore, the occurrence of a defect in the power generation layer can be suppressed, thereby enabling to obtain a solar battery with excellent reliability and yield.

Yields of the thin-film solar batteries of the Example 1 and of the conventional example 2 are shown in Table 2. The yields shown in the Table 2 were obtained by respectively manufacturing 20 thin-film solar batteries having a size of 10 millimeters square of the Example 1 and in the conventional example 2.

TABLE 2

| | Yield (%) |
|---|---|
| Example 1 | 95 |
| Conventional example 2 | 60 |

From the Table 2, it is understood that the thin-film solar battery of the Example 1 can achieve a higher yield than that of the thin-film solar battery in the conventional example 2. Therefore, in the thin-film solar battery in the Example 1, it was confirmed that a thin-film solar battery having an excellent yield was realized.

In the method for manufacturing a thin-film solar battery according to the present embodiment, as described above, a sufficient light scattering effect can be achieved with respect to sunlight incident from the side of the translucent insulating substrate 1 by forming the hollow portions 4 between respective adjacent convex portions 2a in the first transparent conductive film 2. The bottom face of the hollow portion 4 is formed by performing etching along a grain boundary of the transparent conductive film up to the translucent insulating substrate, and thus a sufficient light scattering performance can be achieved.

Further, because a sufficient light scattering performance can be achieved by providing the hollow portions 4 in the first transparent conductive film 2 as described above, the number of irregularities on the surface of the first transparent conductive film 2 can be reduced, thereby enabling to suppress the occurrence of a defect in the power generation layer 5 resulting from irregularities on the surface of the first transparent conductive film 2. Consequently, a decrease in an output voltage due to a defect in the power generation layer 5 can be prevented, thereby enabling to achieve a high photoelectric conversion efficiency. That is, a high photoelectric conversion efficiency can be realized without causing such problems that the number of defects in the power generation layer increase due to an increase in the number of irregularities on the surface of the first transparent conductive film and the output voltage decreases, as in conventional techniques.

In the method for manufacturing a thin-film solar battery according to the present embodiment, the second transparent conductive film 3 is formed on the first transparent conductive film 2, and the power generation layer 5 is formed thereon. Accordingly, irregularities with steep slopes on a transparent conductive film in an interface between the transparent conductive film in the transparent electrode layer and the power generation layer 5 are eased, thereby enabling to suppress the occurrence of a defect in the power generation layer 5 resulting from irregularities with steep slopes, and to improve the yield and reliability.

Consequently, according to the method for manufacturing a thin-film solar battery of the present embodiment, a structure having a high light scattering performance in a wide wavelength range of sunlight is realized without increasing the number of irregularities on the surface of the transparent conductive film in the transparent electrode layer, thereby enabling to manufacture a thin-film solar battery having an excellent photoelectric conversion efficiency, which effectively utilizes a wide wavelength range of sunlight.

In the above explanations, as an example, a thin-film solar battery having a tandem structure in which a pin structure of a power generation layer is provided in two stages has been explained. However, the present invention is also applicable to a structure having a single structure in which the pin structure has a single stage, or a structure in which the pin structure is overlapped in three or more stages, so long as a crystalline layer is included in any layer of the power generation layer, and the effects of the present invention described above can be achieved.

Second Embodiment

A second embodiment explains another method for manufacturing a transparent conductive film in the method for manufacturing a thin-film solar battery according to the present invention with reference to FIG. 4-1 to FIG. 4-3. FIG. 4-1 to FIG. 4-3 are sectional views for explaining an example of a manufacturing process of a thin-film solar battery according to the second embodiment. The method for manufacturing a thin-film solar battery according to the second embodiment is the same as the method for manufacturing a thin-film solar battery according to the first embodiment described above, except for a manufacturing process of a transparent conductive film. Therefore, the manufacturing process of a transparent conductive film is explained below.

As a first transparent conductive film 20, a zinc oxide (ZnO) film containing 0.3 weight % of aluminum (Al) dopant is formed in a film thickness of 0.23 micrometer at a film forming temperature of 200° C., and a zinc oxide (ZnO) film containing the same amount of dopant is formed thereon in a film thickness of 0.22 micrometer at a film forming temperature of 400° C., respectively, by a sputtering method. This lower layer film becomes a crystallized transparent conductive film 210a having crystal grains 2d, and an upper layer film becomes a crystallized transparent conductive film 210b having crystal grains 2e larger than the crystal grains 2d. Accordingly, a transparent conductive film 210 having a two-layer structure is formed by laminating the transparent conductive film 210a and the transparent conductive film 210b (FIG. 4-1). The size of the horizontal width of the crystal grains 2d is respectively about 0.2 micrometer, and the size of the horizontal width of the crystal grains 2e is about 0.3 micrometer.

After the transparent conductive film 210 is immersed in an aqueous solution containing 0.3 weight % of hydrochloric acid at a solution temperature of 30° C. for 60 seconds, washing by pure water for 1 minute or more and drying are performed. By this processing, etching proceeds in a crystal grain boundary of the transparent conductive film 210b in the upper layer and in an amorphous-like region or in a defective region in which oxygen or the like is deficit, to reach an interface between the transparent conductive film 210b in the upper layer and the transparent conductive film 210a in the lower layer. The transparent conductive film 210a in the lower layer is more likely to be etched. Therefore, in etching thereafter, an etching rate of the transparent conductive film 210a in the lower layer becomes faster than that of the transparent conductive film 210b in the upper layer. Consequently, if etching proceeds until the surface of the translucent insulating substrate 1 is exposed, depressions are formed, thereby forming the first transparent conductive film 20 in which a number of convex portions 2f having an overhanging shape are arranged (FIG. 4-2).

As shown in FIG. 4-2, a film thickness m of a lower layer of the convex portion 2f from the translucent insulating substrate 1 is 0.23 micrometer, a film thickness n of an upper layer of the convex portion 2f is 0.12 micrometer and a length k in a substrate horizontal direction at the bottom of the upper layer of the convex portion 2f is 0.25 micrometer. A length j in the substrate horizontal direction at the bottom of the upper layer between the adjacent convex portions 2f is 0.05 micrometer, and the length in a diagonal direction of the substrate is 0.07 micrometer. An angle of the side, which is tapered, in the upper layer of the convex portions 2f is 85 degrees, designating an angle in an in-plane direction of a bottom face as 0 degree. The length l of the hollow portion in the substrate horizontal direction at the height of a boundary between the upper layer of the convex portion 2f and the lower layer of the convex portion 2f is 0.2 micrometer.

The second transparent conductive film 3 is formed next by using an atmospheric-pressure thermal CVD method (FIG. 4-3). The temperature of the transparent conductive film 20 and the temperature in the film forming chamber are heated, for example, up to 540° C., and tin tetrachloride, water, and hydrogen chloride gas are simultaneously sprayed with a flow ratio of hydrogen chloride to tin tetrachloride being 2.0, thereby forming irregularities on the surface. At this time, the second transparent conductive film 3 is not formed at the bottom of depressions on the first transparent conductive film 2, and hollow portions 40 are formed there, using the translucent insulating substrate 1 as a bottom face thereof. Formation of the hollow portions 40 occurs because reactive species are more likely to reach the convex portions as compared to the concave portions, and also because the convex portions 2f of the first transparent conductive film 20 has an overhanging shape, so that reactive species hardly reach the concave portions, and thus the convex portions 2f are preferentially film-formed.

By performing the processing described above, the hollow portions 40 can be formed between the respective convex portions 2f, and a sufficient light scattering effect can be obtained with respect to sunlight incident from the side of the translucent insulating substrate 1 by the formed hollow portions 40.

A thin-film solar battery was manufactured in accordance with the method for manufacturing a thin-film solar battery according to the second embodiment described above, and characteristics and yield of the manufactured solar battery were evaluated like in the first embodiment. As a result, it was confirmed that a thin-film solar battery having an excellent yield and an excellent photoelectric conversion efficiency was realized like in the first embodiment.

INDUSTRIAL APPLICABILITY

As described above, the thin-film solar battery according to the present invention is useful as a thin-film solar battery that effectively utilizes a wide wavelength range of sunlight.

REFERENCE SIGNS LIST

1 TRANSLUCENT INSULATING SUBSTRATE
2 FIRST TRANSPARENT CONDUCTIVE FILM
2a CONVEX PORTION
2c CRYSTAL GRAIN
2d CRYSTAL GRAIN
2e CRYSTAL GRAIN
2f CONVEX PORTION
3 SECOND TRANSPARENT CONDUCTIVE FILM
3a CONVEX PORTION
3b CONCAVE PORTION
4 HOLLOW PORTION
5 POWER GENERATION LAYER
6 BACKSIDE ELECTRODE LAYER
10 THIN-FILM SOLAR BATTERY
20 TRANSPARENT CONDUCTIVE FILM
21 TRANSPARENT CONDUCTIVE FILM
40 HOLLOW PORTION
210 TRANSPARENT CONDUCTIVE FILM
210a TRANSPARENT CONDUCTIVE FILM
210b TRANSPARENT CONDUCTIVE FILM

The invention claimed is:

1. A thin-film solar battery comprising:
a translucent insulating substrate;
a first transparent conductive film formed of a crystalline transparent conductive film on the translucent insulating substrate and having an uneven structure on a surface thereof, said first transparent conductive film having a plurality of convex portions;
a second transparent conductive film formed of a transparent conductive film on the first transparent conductive film and having an uneven structure on a surface thereof, where the uneven structure is rounder than the uneven structure of the first transparent conductive film;
a power generation layer formed on the second transparent conductive film and having at least one crystalline layer to generate power; and
a backside electrode layer formed of a light-reflective conductive film on the power generation layer, wherein
a substantially convex hollow portion projecting from the translucent insulating substrate toward the power generation layer is provided between adjacent convex portions in the uneven structure of the first transparent conductive film,
the substantially convex hollow portion is covered by the second transparent conductive film and
the height of the substantially convex hollow portion is less than the height of each convex portion of the first transparent conductive film.

2. The thin-film solar battery according to claim 1, wherein the convex hollow portion is formed by being surrounded by a surface of the translucent insulating substrate and the second transparent conductive film, with a bottom face thereof being formed by the surface of the translucent insulating substrate.

3. The thin-film solar battery according to claim 1, wherein the convex portion of the first transparent conductive film has an overhanging shape.

4. The thin-film solar battery according to claim 1, wherein the substantially convex hollow portion comprises a plurality of spaced apart substantially convex hollow portions.

5. The thin-film solar battery according to claim 1, wherein the power generation layer has a p-n junction or a pin junction, and is formed by laminating at least a first power generation layer and a second power generation layer, each including a thin-film semiconductor layer that generates power by incident light.

6. The thin-film solar battery according to claim 5, wherein an intermediate layer having optical transparency, light reflectivity, and electrical conductivity, is formed of a transparent conductive film between the first power generation layer and the second power generation layer.

7. The thin-film solar battery according to claim 1, wherein a transparent conductive film is inserted between the power generation layer and the backside electrode layer.

8. The thin-film solar battery according to claim 1, wherein the first transparent conductive film comprises a crystallized zinc oxide and at least one element selected from the group consisting of Al, Ga, In, B, Y, Si, Zr, and Ti as a dopant thereof.

9. The thin-film solar battery according to claim 1, wherein the second transparent conductive film comprises tin oxide and at least element selected from the group consisting of Al, Ga, In, B, Y, Si, Zr, Ti, and F as a dopant thereof.

10. A thin-film solar battery comprising:

a translucent insulating substrate;

a first transparent conductive film formed of a crystalline transparent conductive film on the translucent insulating substrate and having an uneven structure on a surface thereof, said first transparent conductive film having a plurality of convex portions;

a second transparent conductive film formed of a transparent conductive film on the first transparent conductive film and having an uneven structure on a surface thereof, where the uneven structure is rounder than the uneven structure of the first transparent conductive film;

a power generation layer formed on the second transparent conductive film and having at least one crystalline layer to generate power; and a backside electrode layer formed of a light-reflective conductive film on the power generation layer, wherein a substantially convex hollow portion projecting from the translucent insulating substrate toward the power generation layer is provided between and confined to adjacent convex portions in the uneven structure of the first transparent conductive film and the height of the substantially convex hollow portion is less than the height of each convex portion of the first transparent conductive film.

11. A thin-film solar battery comprising:

a translucent insulating substrate;

a first transparent conductive film formed of a crystalline transparent conductive film on the translucent insulating substrate and having an uneven structure on a surface thereof, said first transparent conductive film having a plurality of first convex portions;

a second transparent conductive film formed of a transparent conductive film on the first transparent conductive film and having an uneven structure on a surface thereof, the second transparent conductive film having a plurality of second convex portions, where the second convex portions are rounder, larger in shape, and lesser in numbers than the first convex portions of the first transparent conductive film;

a power generation layer formed on the second transparent conductive film and having at least one crystalline layer to generate power; and a backside electrode layer formed of a light-reflective conductive film on the power generation layer, wherein a substantially convex hollow portion projecting from the translucent insulating substrate toward the power generation layer is provided between and confined to adjacent convex portions in the uneven structure of the first transparent conductive film and the height of the substantially convex hollow portion is less than the height of each convex portion of the first transparent conductive film.

* * * * *